United States Patent [19]

Trask et al.

[11] Patent Number: 5,445,311
[45] Date of Patent: Aug. 29, 1995

[54] ELECTRICAL INTERCONNECTION SUBSTRATE WITH BOTH WIRE BOND AND SOLDER CONTACTS, AND FABRICATION METHOD

[75] Inventors: Philip A. Trask, Laguna Hills; Vincent A. Pillai, Irvine; Thomas J. Gierhart, Fountain Valley, all of Calif.

[73] Assignee: Hughes Aircraft Company, Los Angeles, Calif.

[21] Appl. No.: 324,271

[22] Filed: Oct. 13, 1994

Related U.S. Application Data

[60] Continuation of Ser. No. 187,023, Jan. 27, 1994, abandoned, which is a division of Ser. No. 906,637, Jun. 30, 1992, Pat. No. 5,311,404.

[51] Int. Cl.6 ................. B23K 31/00; H01L 21/02
[52] U.S. Cl. ......................... 228/175; 228/254; 427/125; 427/329; 437/230
[58] Field of Search ............. 228/175, 191, 254, 215, 228/177, 208, 180.5, 180.55; 427/329, 125; 437/230

[56] References Cited

U.S. PATENT DOCUMENTS 5,002,818  3/1991  Licari et al. ............... 428/209
5,118,385  6/1992  Kumar et al. ............... 156/644
5,254,493  10/1993 Kumar ....................... 437/60

FOREIGN PATENT DOCUMENTS 2125618  3/1984  United Kingdom .

Primary Examiner—Mark Rosenbaum
Assistant Examiner—Jeanne M. Elpel
Attorney, Agent, or Firm—Elizabeth E. Leitereg; Michael W. Sales; Wanda K. Denson-Low

[57] ABSTRACT

An electrical interconnection substrate (20) is prepared to receive both wire bonded and soldered connections (60,64,66) by forming a dielectric solder mask (30) over the substrate (20), with openings (36) in the mask (30) to expose the contact pads (22) for which soldered connections are desired. The substrate (20) is exposed to a molten solder alloy (44) in a wave soldering process that dissolves the wire bonding material (28) (preferably gold) from the exposed pads (22) and deposits solder bonding pads (52) in its place. Excess solder is then removed from the substrate, and openings (54) are formed through the solder mask (30) to expose the wire bond contact pads (22'). The selective dissolving of gold bonding layers (28) and their replacement by solder pads (52) prevents the establishment of brittle gold-solder intermetallics, and the deposited solder (52) requires no further heat treatment for correct alloy formation.

19 Claims, 4 Drawing Sheets

ELECTRICAL INTERCONNECTION SUBSTRATE WITH BOTH WIRE BOND AND SOLDER CONTACTS, AND FABRICATION METHOD

This is a continuation application of Ser. No. 08/187,023, filed Jan. 27, 1994, abandoned which is a division of application Ser. No. 07/906,637, now U.S. Pat. No. 5,311,404, filed Jun. 30, 1992.

BACKGROUND OF THE INVENTION

1. Field of the Invention

This invention relates to the preparation of electrical interconnection substrates, particularly high density multiple interconnect (HDMI) substrates, to receive integrated circuit (IC) chips by both wire bonding and solder connections.

2. Description of the Related Art

HDMI multichip module wafers are typically fabricated to accept integrated circuit (IC) dies by either wire bonding the circuit leads to (typically gold) wire bond contact pads on the wafer, by a tape automated bonding (TAB) process, by solder bonding the leads to solder contact pads on the wafer, or by a combination of both wire and solder bonding. Working with both solder bonds and gold wire bonds on HDMI wafers is more complicated than the wave soldering process commonly used in printed wiring board (PWB) fabrication. With PWBs, as opposed to HDMI wafers, a patterned copper network on the board is coated with solder that wets only on the copper contact pads, not on the epoxy PWB material. There is accordingly no need to mask the wave soldering process. With HDMIs, on the other hand, the interconnection substrate cannot simply be subjected to a wave soldering process, since that would preclude gold wire bonding to the same substrate. Even if a photoresist mask were used to protect the contacts intended for wire bonding, such masks are not compatible with the temperatures employed in wave soldering and the hot air knife typically used to remove unwanted solder. Furthermore, gold in the presence of solder forms brittle, undesirable intermetallic compounds.

The typical HDMI is initially provided with gold contact pads only, not solder contact pads or "bumps". The process previously used to allow for soldered contacts as well as wire bonded contacts involves first coating the HDMI wafer with a layer of photoresist, and then forming openings through the photoresist to expose the contact pads that are intended for solder bonding. The gold film is next selectively etched from the exposed contact pads, followed by a solder electroplating step to deposit solder in the contact pad locations from which the gold was previously removed. The wafer is then heated to a temperature at which the lead and tin in the solder melt and form an alloy. The photoresist is removed, along with the overlying unwanted solder, prior to formation of the solder alloy at the desired contact pad locations.

A primary problem with this method is that, because the plated solder must be heated to achieve the proper alloy, the alloy may not be consistent from wafer to wafer; this can lead to variations in solderability, which is an serious drawback. Moreover, the wafer preparation process is complicated by the additional steps required to remove the gold from the desired solder contact pads, and to afterwards heat the deposited solder sufficiently to form an alloy. The heat treatment must be performed in an inert atmosphere, typically nitrogen, which is fairly expensive to provide. The additional processing increases both the cost and the time required to prepare the HDMI substrate.

SUMMARY OF THE INVENTION

The present invention seeks to provide a method of preparing an electrical interconnection substrate, such as an HDMI, to receive IC chips by either wire bonded or soldered connections, without the wafer-to-wafer inconsistency in the ultimate solder alloy that was encountered in the past. It is also desired to eliminate the need for additional process steps to etch away the gold from the desired solder pad locations, or to heat the wafer for the formation of solder alloy pads. A simpler preparation process, and a resultant interconnection substrate that includes a protective coating and is less expensive to fabricate, are also sought.

These goals are accomplished by initially providing an electrical interconnection substrate with a series of wire bond contact pads that include a layer of conductive wire bonding material, typically gold. A dielectric solder mask is formed over the substrate, with openings in the mask to expose the contact pads for which soldered connections are desired. The substrate is then exposed to a molten solder alloy, preferably through a wave solder process. This dissolves the wire bonding material from the exposed contact pads into the molten solder, and in the same step deposits a layer of solder both onto the mask and into the mask openings, where it forms solderable contact pads. The solder between the openings is then removed from the mask, preferably with a hot air-knife, followed by the final formation of additional openings in the solder mask to expose the contact pads for which wire bonding is desired. The remainder of the mask if preferably left in place on the substrate to form a protective coating.

The wire bond contact pads preferably consist of a layer of conductive, substantially non-ductile material surmounted by a layer of gold about 1–5 microns thick; this thickness is sufficient to be wire bondable, but thin enough to dissolve into the molten solder. Where fine geometries are involved the mask is preferably an aluminum-on-dielectric laminate so that substantially straight and vertical openings are attained, and multiple passes can be made through a molten solder alloy bath to assure removal of the gold from the desired contact pads and its replacement with solder. The aluminum portion of the mask is removed prior to exposing the substrate to the molten solder.

When prepared in this manner, the interconnection substrate is ready for IC attachment and requires no further heat treatment to alloy the solder. Since the wave soldering process dissolves away the gold from the pads to be solder coated and replaces the gold with solder in the same step, there is no need for a separate gold removal etching step. The dielectric layer readily withstands the temperature of both the molten solder and of the hot air knife. Since successive wafers are subjected to the same molten solder, consistency in the solder alloy is assured from wafer to wafer.

Further features and advantages of the invention will be apparent to those skilled in the art from the following detailed description, taken together with the accompanying drawings.

DETAILED DESCRIPTION OF THE INVENTION

Figure 1:
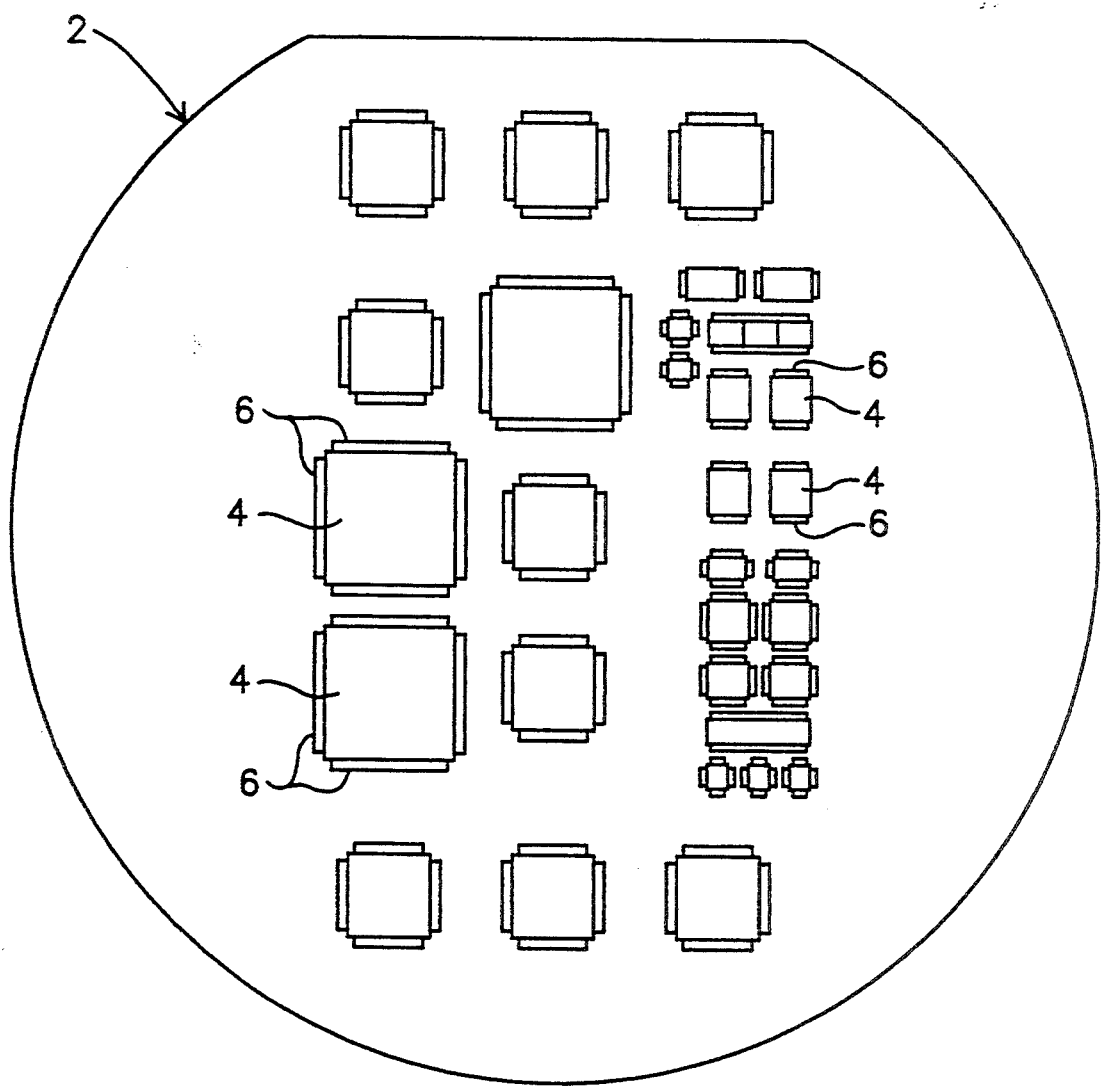
FIG. 1 is a plan view of an HDMI substrate, showing representative IC chip locations for both wire and solder bonding.

FIG. 1 is a plan view of an HDMI wafer 2 that can be prepared through the teachings of the invention to receive IC chips with both wire bonded and soldered connections. Chip pads 4 are provided on the wafer's surface to receive respective IC chips, which are typically held in place with a layer of epoxy. A series of discrete bonding pads surround each chip location, or are at least formed along some if its sides; the individual bonding pads are included within the bonding pad areas 6 indicated in the figure in a conventional manner.

Figure 2:
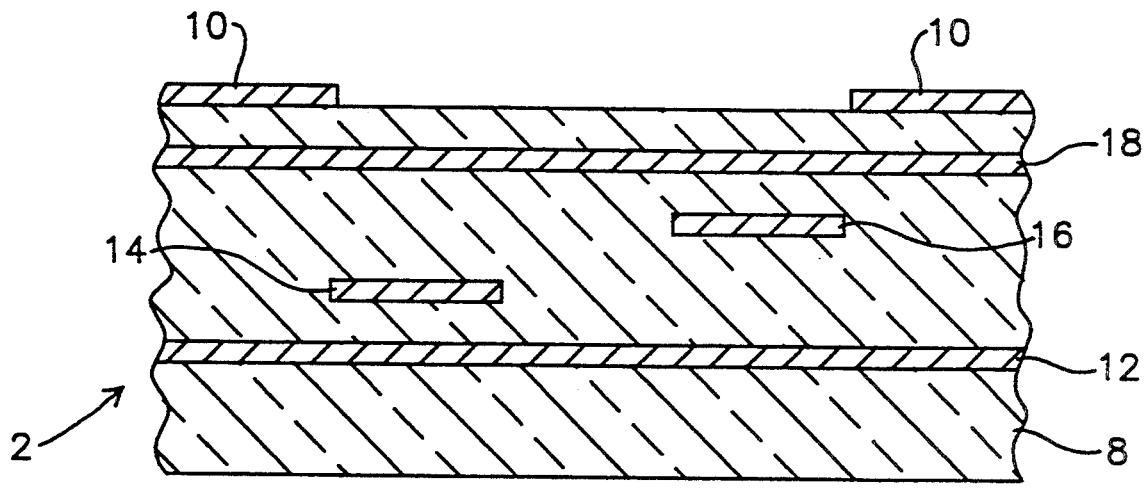
FIG. 2 is a sectional view of an HDMI that may be used to practice the invention.
Figure 3A:
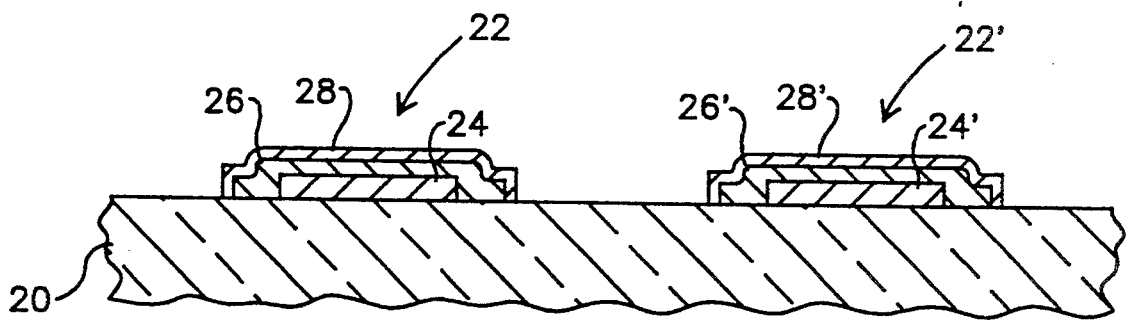
FIGS. 3a–3h are sectional views, not to scale, illustrating successive steps in the preparation of an HDMI substrate to receive both wire bonded and soldered connections, with two alternate connection schemes illustrated in FIGS. 3g and 3h.

The HDMI wafer provides a series of electrical interconnects for the various contact pads, as indicated by the sectional view of FIG. 2. Typically formed on a silicon substrate 8, the wafer 2 includes various levels of electrical feed lines that are connected to respective contact pads through vertical via interconnections (not shown). A pair of contact pads 10 are illustrated, along with a power lead 12, separate signal leads 14 and 16, and a ground lead 18. The power and ground leads are illustrated as extending laterally, while the signal leads 14 and 16 extend into the page and constitute x,y orthogonal pair of signal lines; all of the leads are buried within the HDMI wafer. The various lead lines are separated from each other, as well as from the contact pads, by dielectric material. A process used in the present invention to prepare such an HDMI wafer to receive both solder and wire bonded contacts is illustrated in FIGS. 3a–3h. Referring first to FIG. 3a, an HDMI wafer 20 is shown with a pair of contact pads 22 and 22'. The wafer will be processed in the ensuing steps so that pad 22 emerges as a solderable contact pad, while pad 22' remains a wire bond pad; both pads are identical to begin with. Each typically includes respective aluminum pads 24, 24', covered by top metal layers 26, 26' of a conductive, non-ductile material such as titanium/-tungsten or nickel. A layer of a relatively soft wire bonding material 28, 28' is formed on top of the top metal; this layer is preferably gold, but may also be formed from other materials, such as copper, copper alloy or tin, that are wettable by molten solder. Aluminum is not suitable for this purpose, since it is not wet by molten solder. As explained below, it is important that the wire bond layers 28, 28' be thick enough for wire bonding, and yet be thin enough to readily dissolve when exposed to a molten solder. For this purpose gold with a thickness of about 1–5 microns has been found to be suitable.

Figure 3B:
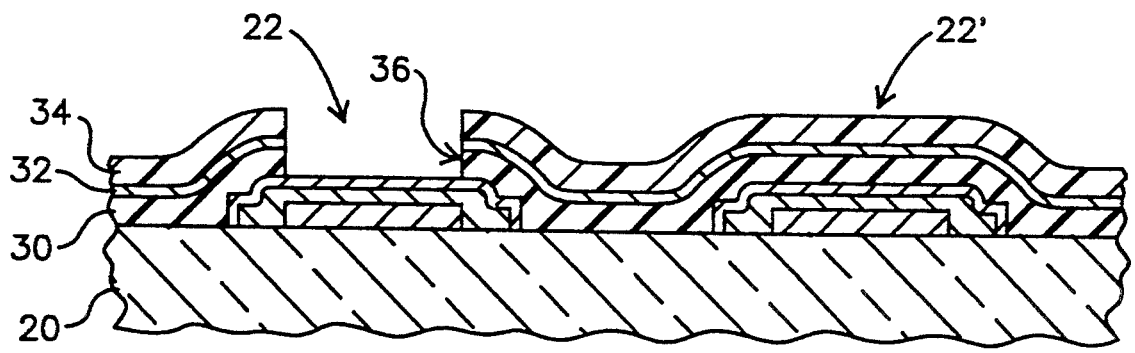

Both of the pads 22 and 22' are initially suitable for wire bonding. The beginning of the process to convert pad 22 to a solderable element, while leaving pad 22' wire bondable, is illustrated in FIG. 3b. A dielectric solder mask 30 is first deposited over the HDMI wafer. The mask 30, which must be able to withstand contact with molten solder, is preferably a layer of polyimide about 10 microns thick that is spin-coated and cured over the wafer and contact pads. Other mask materials that could be used include silicon dioxide and silicon nitride. A layer of aluminum 32, preferably about 0.5 microns thick, is sputtered over the polyimide layer 30 to establish an anisotropic (straight and vertical) subsequent etch through the polyimide 30 to expose pad 22. If SiO$_2$ or silicon nitride is used for the dielectric mask 30, the aluminum layer 32 is not needed. A layer of photoresist 34 is next spin-coated on top of the sputtered aluminum layer 32, patterned and developed to form openings in the photoresist over pad 22 and all of the other pads to be made solderable. The aluminum layer 32 is then wet etched, replicating therein the openings previously established in the photoresist layer 34. A reactive ion etch is subsequently used to pattern the polyimide layer 30, using the patterned resist and aluminum layers as the etching mask. As a result an opening 36 is completed through the polyimide, aluminum and photoresist layers to expose pad 22. With the aluminum layer 32 ensuring that the polyimide sidewall profile is nearly straight, a solder bonding pad subsequently formed in the opening will also have straight sidewalls to prevent shorting between bonding pads when IC leads are solder attached.

Figure 3C:
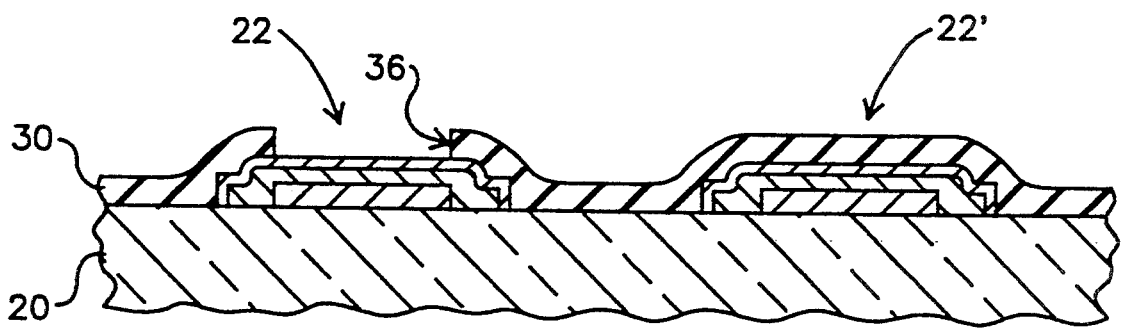

After the solder pad opening 36 has been patterned any remaining photoresist is removed, preferably with a wet photoresist stripper solution, followed by removal of the hard aluminum mask layer 32 preferably with a wet aluminum etch solution. The resultant HDMI wafer with contact pad 22 exposed and pad 22' covered by the polyimide is shown in FIG. 3c.

Figure 3D:
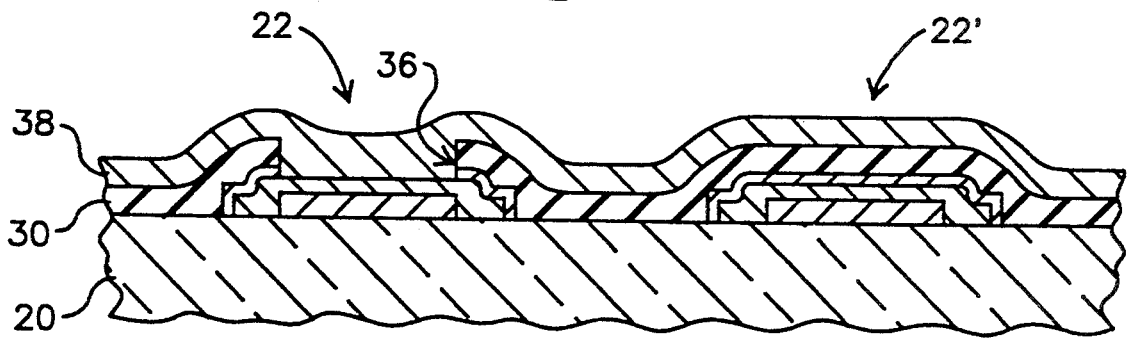

In the next step, the results of which are shown in FIG. 3d, the wafer is coated with a solder alloy layer 38 that extends into the opening for pad 22 as well as over the remainder of the wafer. This may be accomplished by loading the wafer into a solder jig that includes recesses to accept several wafers. The wafers can be attached to the jig with high temperature tape on their outer edges to prevent them from lifting out of the recesses during subsequent wave soldering and hot air-knife leveling. The wafers in the jig are preferably run through a wave solder system that is equipped with a hot air-knife leveling unit. Several such systems are available, such as the Teledyne/Halco, Inc. Model 350.

Figure 4A:
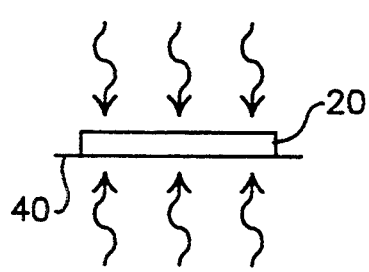
FIGS. 4a–4f are illustrative diagrams illustrating successive steps in the wave flow solder and hot air knife process preferably used for the invention.
Figure 4B:
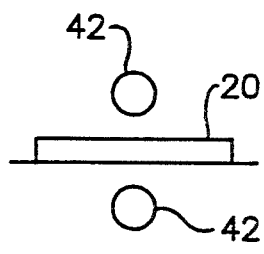
Figure 4C:
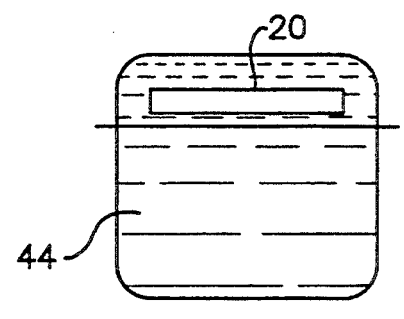

The solder application process is illustrated in FIGS. 4a–4f. In FIG. 4a the wafer 20 is shown being preheated, preferably to a temperature of about 230°–250° C., to prevent it from cracking due to thermal shock when it is subsequently exposed to a molten solder. The wafer is carried on a perforated belt 40 during this process. As the wafer enters the wave solder system, solder flux 42 is automatically applied to it (FIG. 4b). The wafer is then passed through a wave solder bath 44 as illustrated in FIG. 4c, and receives a coating of molten solder alloy. The temperature of the bath depends upon the particular solder alloy employed; most usable solder alloys will have a molten temperature in the range of about 230°–270° C. During a single pass through the wave solder system, the thin layer of gold 28 is dissolved from the exposed pad 22 into the solder bath, and the solder layer 38 fills the polyimide opening for pad 22 in its place. If fine pad geometries are involved, several passes may be made through the wave solder bath to assure a complete removal of the exposed gold and its replacement by solder. Depending upon the pad pitch, additional passes may be recommended to ensure that all pads are solder coated. The dissolved gold is dispersed into the large reservoir of molten solder. Although gold is known to form undesirable embrittling intermetallics with solder, the very small quantities of gold dissolved into the large solder bath (typically about 20-50 gallons) will not build up sufficiently between normal bath replacement cycles (typically about every two weeks) to be detrimental.

Figure 4D:
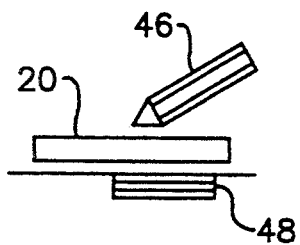

In the next step of the solder process, illustrated in FIG. 4d, a conventional hot air-knife 46 removes the excess solder between pads from the upper substrate surface, preferably operating at a temperature of about 424° C. and an angle to horizontal of about 25-30 degrees. All of the solder is removed from the underside of the substrate 20 by the lower portion of the air knife 48, which operates at the same temperature as the upper air-knife but is at an angle of about 0-3 degrees to horizontal.

Figure 4E:
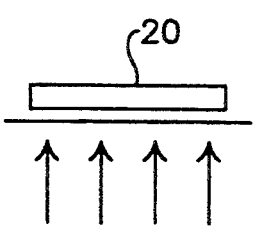
Figure 4F:
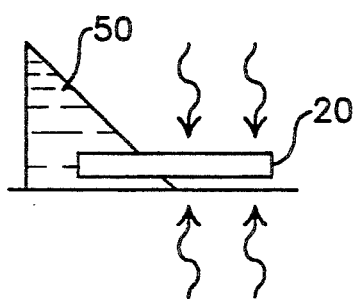

Following the removal of the excess solder, the substrate is gradually returned to room temperature by a flow of forced cooling air (FIG. 4e). In the final step, illustrated in FIG. 4f, the flux is removed with an aqueous cleaner 50 and the wafer is dried.

Figure 3E:
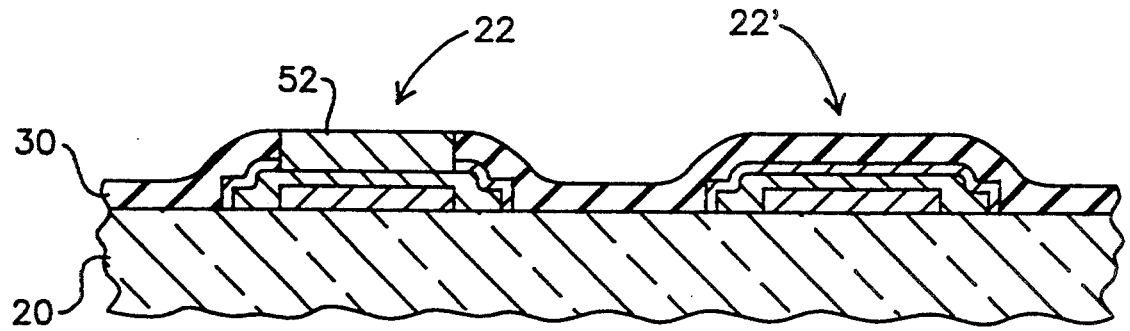

The solder contact pad 52 which remains in the exposed opening 36 over pad 22 after the excess solder has been removed is shown in FIG. 3e. After being reflowed by the hot air-knife, the solder pad is ready to receive a TAB Bonded die attachment with no further processing required.

Figure 3F:
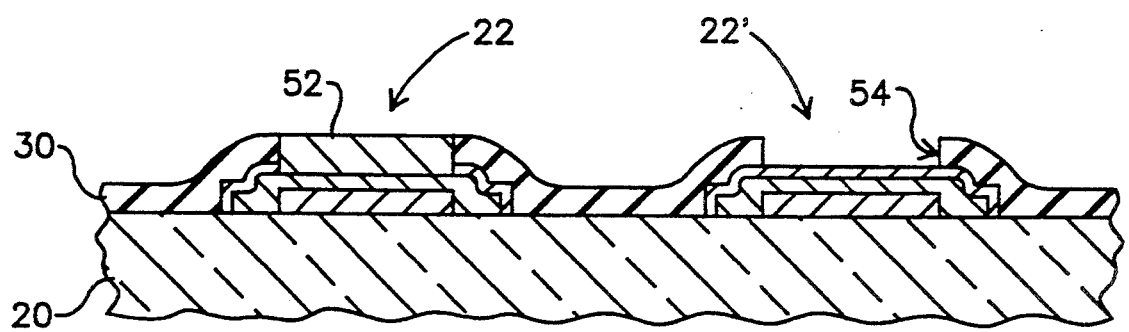

The final processing steps to prepare the wafer involve the wire bond pad 22'. A photoresist layer is applied to the wafer and patterned to expose openings over the desired wire bond pads, such as pad 22'. The wafer is next subjected to a reactive ion etch to remove the portion of the polyimide layer that is exposed by the patterned photoresist, followed by a removal of the remaining photoresist. As a result, an opening 54 is formed in the polyimide to expose the gold bonding pad 22', as shown in FIG. 3f.

Figure 3G:
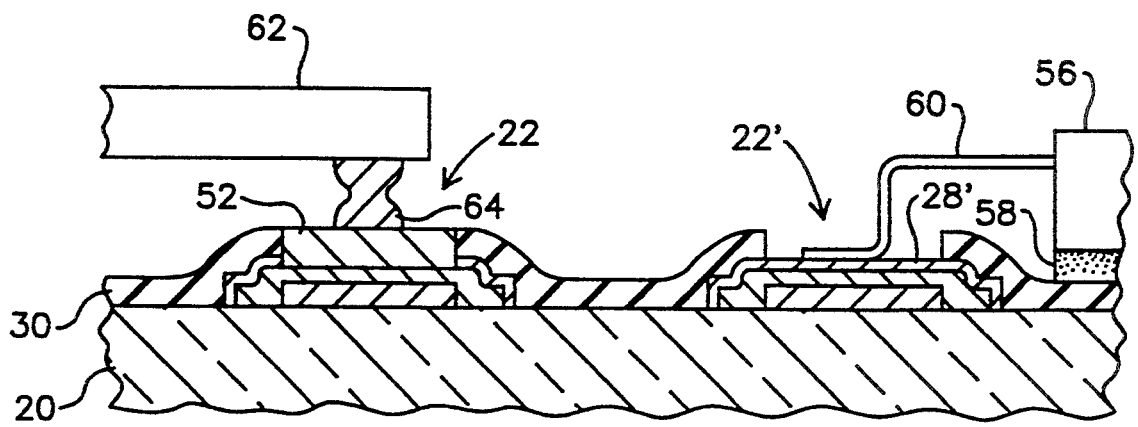

FIG. 3g illustrates the attachment of IC dies to the two pads 22 and 22'. It should be noted that the polyimide layer 30 has been left in place as a protective coating for wafer 20. An IC chip 56 is shown attached to the upper surface polyimide layer 30 by an epoxy 58, with a gold lead wire 60 extending out from the chip and wire bonded to the gold layer 28' on pad 22'. Various types of wire bonding processes may be used for this purpose, such as thermal compression, ultrasonic, thermal sonic and microgap bonding. These processes are well known, and are described for example in Licari and Enlow, *Hybrid Microcircuit Technology Handbook*, Noyes Publications, 1988, pages 191-202.

IC chips may be bonded to the solder bonding pad 22 with the circuits either face-down or face-up. A face-down flip-chip contact is illustrated in FIG. 3g, with a circuit on chip 62 bonded directly to the solder pad 52 by means of solder "bumps" 64. As with the other bonding techniques described herein, flip-chip bonding is known and is not claimed per se as part of the invention.

Figure 3H:
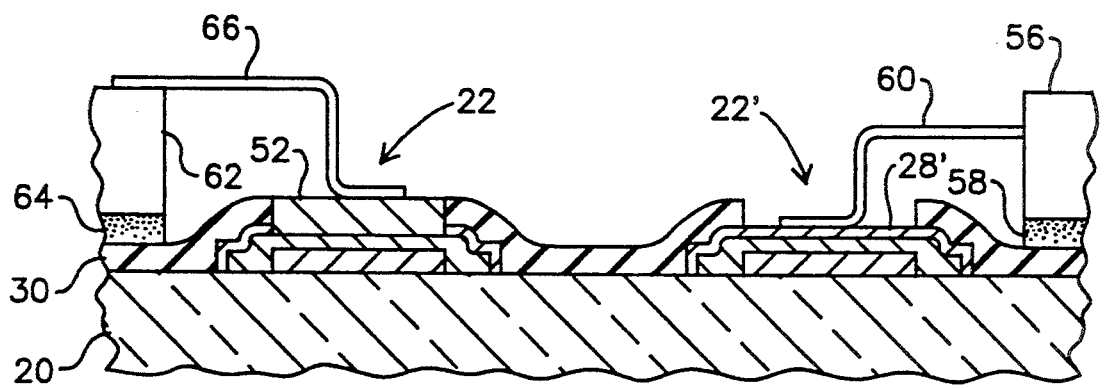

Another solder bonding technique for pad 22 is illustrated in FIG. 3h. In this case a die 62 has been adhered to the polyimide layer 30 with an epoxy layer 64 in a TAB process. A lead 66 of copper or other metal that has been coated with solder extends from the circuit on the upper surface of chip 62 and is bonded to the solder pad 52 by heating the lead, preferably with a laser, to reflow the solder and establish the contact. As opposed to the flip-chip attachment technique, in which all of the bonding pads for a given die are heated simultaneously and bonded at one time, the laser TAB process establishes bonds wire-by-wire. TAB is well known and is described for example in Licari and Enlow, supra, pages 203-208.

The present invention offer numerous advantages. Since the molten solder is in alloy form when it is first applied to the solder bonding pad, there is no need for a later heating step to establish the alloy, and a high degree of uniformity is achieved between different wafers in a production run. Also, since the exposed gold layer is dissolved into the same solder bath from which the solder contact is obtained, the prior requirement for a separate gold removal step before a solder coating could be applied is eliminated. Commercially available production wave solder hot air-knife equipment can be used and, since the solder is stoichiometrically ready for IC lead attachment by solder reflow, the wave soldered pad requires no further heat treatment. The polyimide or other dielectric forms a protective layer that can withstand the temperatures to which the wafers are exposed during the wave soldering process, and it also delineates the pads to be solder coated and separates the leads, preventing solder from shorting two or more leads with unwanted solder. By eliminating fabrication steps that were previously required, a more efficient and economical process is achieved. Furthermore, the selective removal of gold from those pads where solder is desired prevents the formation of brittle gold-solder intermetallics.

While particular embodiments of the invention have been shown and described, numerous variations and alternate embodiments will occur to those skilled in the art. For example, the wafer could be dipped in molten solder, kept hot and subjected to an air blast to remove excess solder, in place of the wave solder and air-knife technique described above, although this is not recommended for fine pad geometries. It is accordingly intended that the invention be limited only in terms of the appended claims.

We claim:

1. A method of preparing an electrical interconnection substrate to receive electrical circuit elements by both wire bonded and soldered connections, the substrate having a plurality of wire bond contact pads formed with a layer of conductive wire bonding material, comprising:

forming a solder mask over said substrate, with openings in said mask exposing the contact pads for which soldered connections are desired, exposing said substrate to a molten solder alloy to dissolve the wire bonding material from the exposed contact pads into the molten solder, and to deposit a layer of solder onto said mask and into said mask openings, the solder deposited into said mask openings forming solderable contact pads, removing solder from said mask between said openings, and exposing through said solder mask the wire bond contact pads for which wire bonding is desired.

2. The method of claim 1, wherein said wire bond contact pads for which wire bonding is desired are exposed by forming openings in said mask over said contact pads, while leaving the remainder of said mask on the substrate.

3. The method of claim 2, said mask comprising polyimide.

4. The method of claim 1, wherein said wire bond contact pads are provided with said layer of wire bonding material thick enough to be wire bondable, but thin enough to dissolve into said molten solder.

5. The method of claim 4, wherein said wire bond contact pads are provided with a layer of conductive, substantially non-ductile material surmounted by a layer of gold about 1–5 microns thick.

6. The method of claim 1, wherein said substrate is exposed to said molten solder alloy by passing it through a molten solder alloy bath.

7. The method of claim 6, wherein said substrate is exposed to said molten solder alloy by a wave soldering process.

8. The method of claim 6, wherein said substrate is passed through multiple passes of said molten solder alloy bath.

9. The method of claim 1, wherein an air-knife is used to remove said solder from between said openings.

10. The method of claim 1, wherein said mask is provided as an aluminum on dielectric laminate to obtain substantially straight openings through said mask.

11. The method of claim 10, wherein said mask openings are formed by wet etching said aluminum and reactive ion etching said dielectric.

12. The method of claim 10, wherein the aluminum portion of said mask is removed prior to exposing said substrate to said molten solder.

13. The method of claim 1, further comprising the steps of wire bonding at least one wire bondable integrated circuit (IC) chip to at least some of said exposed wire bond contact pads, and solder connecting at least one solder connectable IC chip to at least some of said solderable contact pads.

14. A method of converting a wire bondable contact pad on a substrate to a solderable contact pad, said wire bondable contact pad having a layer of conductive wire bondable material, comprising:

removing said layer of conductive wire bondable material from said wire bondable contact pad by exposing it to a molten solder alloy and dissolving it into said solder alloy, and depositing a solder alloy onto said contact pad with the same molten solder exposure used to dissolve said wire bondable material.

15. The method of claim 14, wherein said contact pad is provided with said layer of wire bonding material thick enough to be wire bondable, but thin enough to dissolve into said molten solder.

16. The method of claim 15, wherein said contact pad is provided with a layer of conductive, substantially non-ductile material surmounted by a layer of gold about 1–5 microns thick.

17. The method of claim 14, wherein said layer of conductive wire bondable material is removed and said solder alloy is deposited onto said contact pad by passing said substrate through a molten solder alloy bath.

18. The method of claim 17, wherein said contact pad is exposed to said molten solder alloy by a wave soldering process.

19. The method of claim 17, wherein said substrate is passed through multiple passes of said molten solder alloy bath.

* * * * *